United States Patent
Balakrishnan et al.

(10) Patent No.: US 9,627,381 B1
(45) Date of Patent: Apr. 18, 2017

(54) CONFINED N-WELL FOR SIGE STRAIN RELAXED BUFFER STRUCTURES

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/969,678

(22) Filed: Dec. 15, 2015

(51) Int. Cl.
| | |
|---|---|
| *H01L 27/00* | (2006.01) |
| *H01L 27/092* | (2006.01) |
| *H01L 21/02* | (2006.01) |
| *H01L 21/762* | (2006.01) |
| *H01L 21/8238* | (2006.01) |
| *H01L 29/10* | (2006.01) |
| *H01L 29/167* | (2006.01) |
| *H01L 21/265* | (2006.01) |
| *H01L 29/06* | (2006.01) |
| *H01L 29/165* | (2006.01) |

(52) U.S. Cl.
CPC ...... *H01L 27/092* (2013.01); *H01L 21/02381* (2013.01); *H01L 21/02532* (2013.01); *H01L 21/26513* (2013.01); *H01L 21/76224* (2013.01); *H01L 21/823807* (2013.01); *H01L 21/823878* (2013.01); *H01L 29/0649* (2013.01); *H01L 29/1054* (2013.01); *H01L 29/165* (2013.01); *H01L 29/167* (2013.01)

(58) Field of Classification Search
CPC H01L 27/092; H01L 27/0924; H01L 27/0928
See application file for complete search history.

(56) References Cited

U.S. PATENT DOCUMENTS

| | | | |
|---|---|---|---|
| 6,809,016 | B1 | 10/2004 | Xiang |
| 7,064,399 | B2 | 6/2006 | Babcock et al. |
| 7,510,916 | B2 | 3/2009 | Chu |
| 8,471,342 | B1 | 6/2013 | Flachowsky et al. |
| 2003/0089901 | A1* | 5/2003 | Fitzgerald ......... H01L 21/02381 257/19 |
| 2006/0220112 | A1 | 10/2006 | Zhu et al. |

* cited by examiner

*Primary Examiner* — Matthew Reames
(74) *Attorney, Agent, or Firm* — Louis J. Percello; Michael J. Chang, LLC

(57) ABSTRACT

Techniques for effectively confining n-well dopants during fabrication of relaxed SiGe on SRB devices are provided. In one aspect, a method for forming a semiconductor device includes the steps of: forming a SiGe stress relief buffer layer on a substrate; growing a bottom confinement layer on the stress relief buffer layer; growing a SiGe layer on the bottom confinement layer; growing a top confinement layer on the SiGe layer; forming STI regions extending through the top confinement layer, through the SiGe layer, and at least down to the bottom confinement layer, wherein the STI regions define at least one active area in the SiGe layer; and implanting at least one well dopant into the at least one active area which is confined to the at least one active area by the top confinement layer, the bottom confinement layer, and the STI regions. A semiconductor device is also provided.

19 Claims, 5 Drawing Sheets

CONFINED N-WELL FOR SIGE STRAIN RELAXED BUFFER STRUCTURES

FIELD OF THE INVENTION

The present invention relates to relaxed silicon germanium (SiGe) on strain relaxed buffer (SRB) devices, and more particularly, to techniques for effectively confining n-well dopants during fabrication of relaxed SiGe on SRB devices.

BACKGROUND OF THE INVENTION

Relaxed silicon germanium (SiGe) on strain relaxed buffer (SRB) has been chosen as the up-front option for 7 nanometer (nm) complementary metal-oxide semiconductor (CMOS) technology. However, building CMOS on bulk SiGe substrate comes with new challenges.

One notable challenge is the formation of well doping. P-well doping with boron as dopant is not generally a problem (i.e., because boron diffuses even slower in SiGe than in silicon (Si)). However, forming an n-well presents some notable challenges. Arsenic is the typical choice for n-well doping under the p-channel field effect transistor (pFET) active regions. Arsenic has a much higher diffusion in SiGe than it does in silicon (Si), leading to unwanted diffusion of arsenic laterally into the p-well region and/or upward into the pFET channel region during thermal processing, destroying the devices. Phosphorus (another n-well dopant) diffuses slightly less, but the overall problem remains the same.

Shallow trench isolation (STI) currently is at a maximum of 100 nm. A $5 \times 10^{17}$-$1 \times 10^{18}$ arsenic well implant goes deeper than that, especially with its increased diffusion value in SiGe.

Therefore, improved doping and isolation techniques are needed for relaxed SiGe on SRB technology.

SUMMARY OF THE INVENTION

The present invention provides techniques for effectively confining n-well dopants during fabrication of relaxed silicon germanium (SiGe) on stress relief buffer (SRB) devices. In one aspect of the invention, a method for forming a semiconductor device is provided. The method includes the steps of: forming a SiGe stress relief buffer layer on a substrate; growing a bottom confinement layer on the stress relief buffer layer; growing a SiGe layer on the bottom confinement layer; growing a top confinement layer on the SiGe layer; forming shallow trench isolation (STI) regions extending through the top confinement layer, through the SiGe layer, and at least down to the bottom confinement layer, wherein the STI regions define at least one active area in the SiGe layer; and implanting at least one well dopant into the at least one active area, wherein the at least one well dopant is confined to the at least one active area by the top confinement layer, the bottom confinement layer, and the STI regions.

In another aspect of the invention, a semiconductor device is provided. The semiconductor device includes: a SiGe stress relief buffer layer on a substrate; a bottom confinement layer on the stress relief buffer layer; a SiGe layer on the bottom confinement layer; a top confinement layer on the SiGe layer; STI regions extending through the top confinement layer, through the SiGe layer, and at least down to the bottom confinement layer, wherein the STI regions define at least one active area in the SiGe layer; and at least one well dopant implanted into the at least one active area, wherein the top confinement layer, the bottom confinement layer, and the STI regions confine the at least one well dopant to the at least one active area.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for confining (e.g., arsenic) n-well doping during implantation and subsequent processing by surrounding the n-well implant with silicon (Si) or shallow trench isolation (STI) in relaxed silicon germanium (SiGe) on strain relaxed buffer (SRB) semiconductor devices. As provided above, a notable challenge with SiGe on SRB devices is the increased diffusion of n-well dopants, such as arsenic (As), which can destroy the devices. Advantageously, the present techniques can be used to effectively confine the n-well dopants in such devices.

As generally known in the art, SiGe on SRB technology is an effective way to provide a relaxed SiGe active layer on a Si substrate. See, for example, Kim et al., "High-Quality Strain Relieved SiGe Buffer Prepared by Means of Thermally-Driven Relaxation and CMP Process," Abstract, SiGe, Ge & Related Compounds: Materials, Processing and Devices Symposium (October 2004), the contents of which are incorporated by reference as if fully set forth herein. Basically, in order to account for lattice mismatch between Si and SiGe, when forming SiGe on a Si substrate the germanium content can be gradually increased (e.g., linearly or step graded) as one moves farther away from the Si substrate. Thus, the crystal structure of the material gradually transitions from that of Si near the substrate to that of SiGe at the top of the SRB. The result is what is referred to as an SRB. Based on this process, the top of the SRB layer will be relaxed in that any degree of lattice mismatch (from Si to SiGe) is compensated by the gradual increase in Ge concentration throughout the SRB. A relaxed active layer is beneficial for enhanced electron and hole mobility. In the figures presented herewith, shading is used to denote the Ge concentration gradient throughout the SRB, wherein the shading darkens with an increase in Ge concentration.

Figure 1:
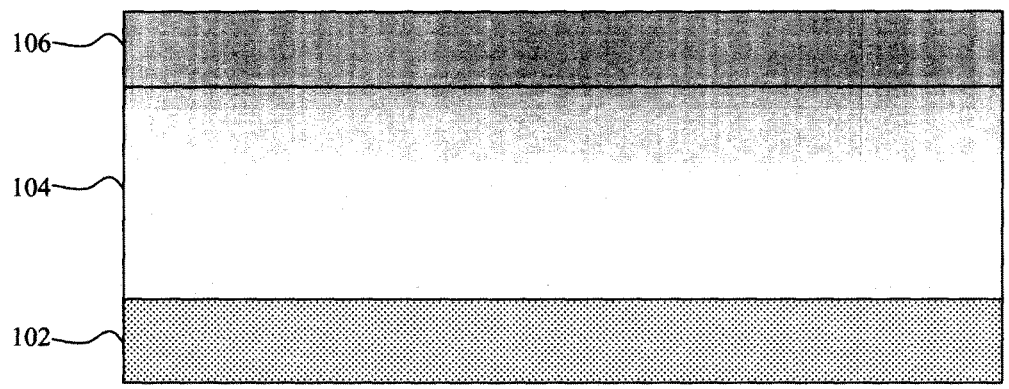
FIG. 1 is a cross-sectional diagram illustrating a (e.g., silicon (Si)) substrate 102 and a silicon germanium (SiGe) stress relief buffer (SRB) layer 104 having been formed on a (e.g., silicon (Si)) substrate, wherein a top portion of the SRB layer 104 is relaxed according to an embodiment of the present invention.

Thus, as shown in FIG. 1, the present process begins with a substrate 102 and a (SiGe) SRB layer 104 having been formed on the substrate. Based on the above-described stress-relief process, a top portion 106 of the SRB layer 104 is relaxed. According to an exemplary embodiment, the substrate 102 is a Si substrate, and the SRB layer 104 is epitaxially grown by co-depositing Si and Ge on the substrate 102. As is known in the art, the SRB layer 104 can be formed as a series of distinct layers (step-grading) where the Ge content increases in each successive layer moving up from the substrate 102. In that case, the relaxed top portion 106 of the SRB layer 104 is a distinct top layer of the SRB (having a target Ge concentration). Alternatively, the Ge concentration of the SRB layer 104 can be gradually increased as the layer is grown (linearly) (rather than incrementally in different layers) until the top portion 106 of the SRB layer 104 is formed having a target Ge concentration. According to an exemplary embodiment, the top portion 106 of the (SiGe) SRB layer 104 has a target Ge concentration of from about 15 atomic percent (at. %) to about 30 at. %, and ranges therebetween. Atomic percent gives the percentage of one kind of atom (in this case Ge atoms) relative to the total number of atoms in the material. The top portion 106 of the SRB layer 104 preferably has a thickness of from about 1 micrometer (μm) to about 3 μm, and ranges therebetween.

Figure 2:
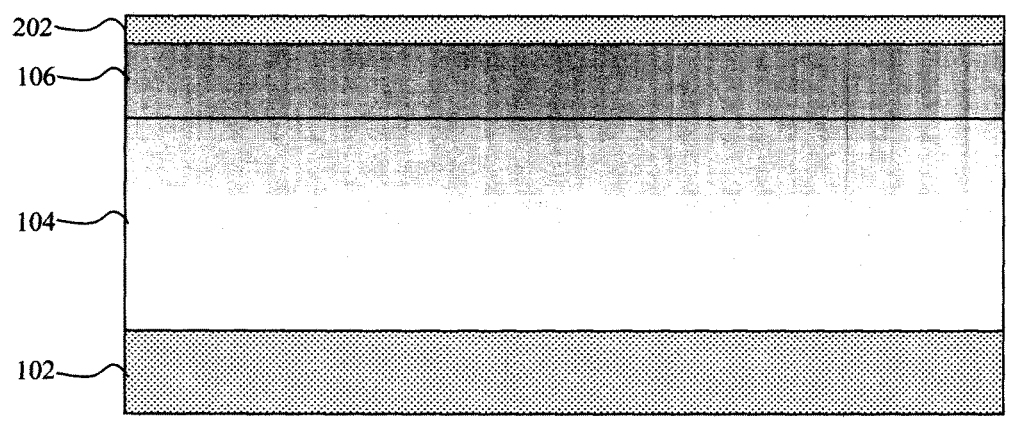
FIG. 2 is a cross-sectional diagram illustrating a thin (bottom) confinement layer having been grown on the relaxed top portion of the SRB layer according to an embodiment of the present invention.

Next, as shown in FIG. 2, a (first) thin confinement layer 202 is grown on the relaxed top portion 106 of the SRB layer 104. As will be described in detail below, the present structure will include a bottom confinement layer (i.e., layer 202), a top confinement layer (layer 402—see below), and a SRB layer 302 (see below) sandwiched between layer 202 and layer 402. The bottom and top confinement layers 202 and 402 will prevent diffusion of the well dopants implanted into the SRB layer 302 (especially the n-well dopants which have a greater rate of diffusion in SiGe materials than in Si). Shallow trench isolation (or STI regions) will be used to prevent lateral diffusion of the well dopants. Accordingly, layers 202 and 402 may also be referred to herein as bottom and top confinement layers and/or as first and second confinement layers, respectively.

According to an exemplary embodiment, the confinement layer 202 is formed from Si epitaxially grown on the top portion 106 of the SRB layer 104. Since the confinement layer 202 is formed from a different material than the SRB layer 104, it is important that the confinement layer 202 is kept thin so as not to introduce too much lattice-mismatch into the stack. Basically, if thin enough, epitaxial Si can be forced to conform to the lattice structure of the material on which it is being grown (in this case the SiGe SRB layer 104). According to an exemplary embodiment, the confinement layer 202 is formed to a thickness of from about 2 nanometers (nm) to about 10 nm, and ranges therebetween, e.g., about 5 nm.

Figure 3:
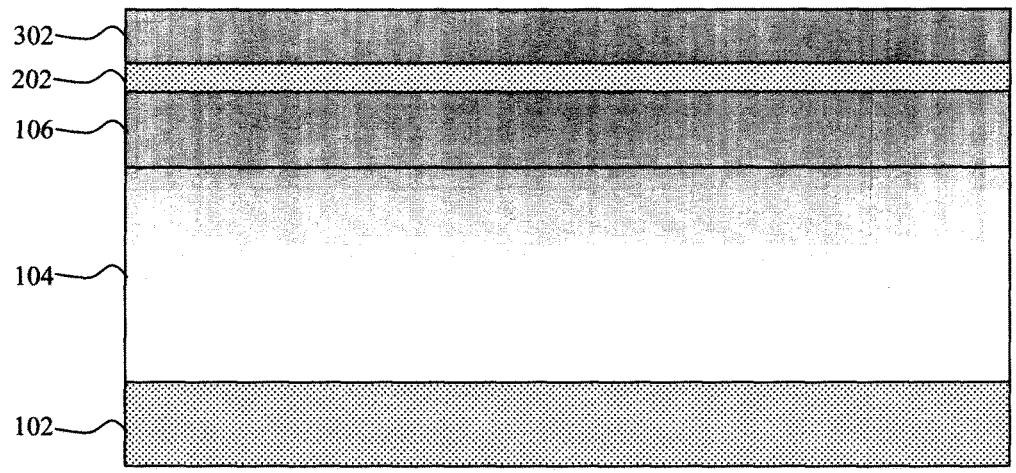
FIG. 3 is a cross-sectional diagram illustrating a relaxed SiGe layer having been grown on the interlayer according to an embodiment of the present invention.
Figure 4:
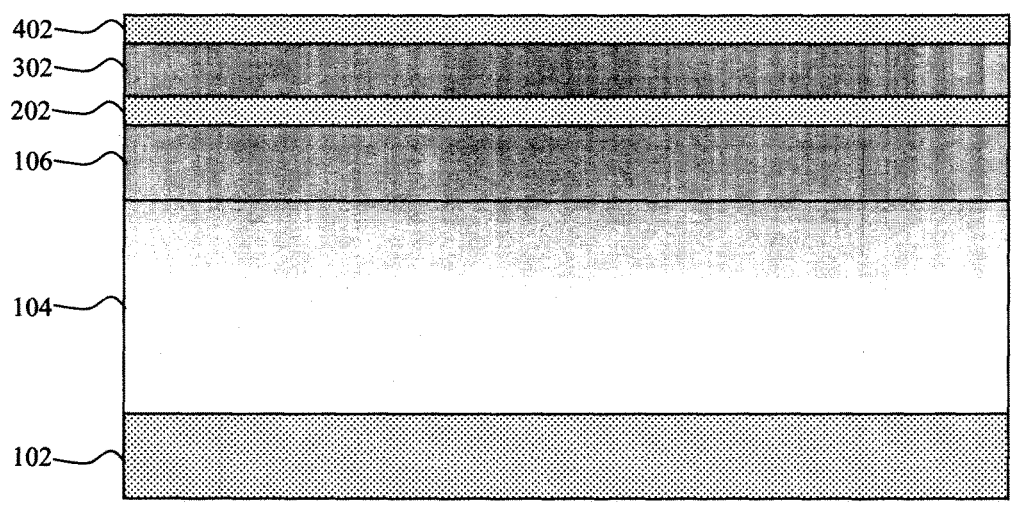
FIG. 4 is a cross-sectional diagram illustrating a top confinement layer having been grown on the relaxed SiGe layer according to an embodiment of the present invention.

As shown in FIG. 3, a relaxed SiGe layer 302 is next grown on the interlayer 202. As described above, by keeping the interlayer 202 thin, the crystal structure of the interlayer 202 can be conformed to that of the underlying (SiGe) SRB layer 104. Thus, when (epitaxially) growing the SiGe layer 302 on the interlayer 202, a relaxed SiGe crystal structure is achieved in SiGe layer 302. Preferably, the SiGe layer 302 has the same above-described target Ge concentration, e.g., of from about 15 at. % to about 30 at. %, and ranges therebetween. According to an exemplary embodiment, the SiGe layer 302 is grown having a thickness of from about 100 nm to about 500 nm, and ranges therebetween.

A top confinement layer 402 is next grown on the SiGe layer 302, such that the SiGe layer 302 is sandwiched between the bottom confinement layer 202 and the top confinement layer 402. As provided above, the bottom confinement layer 202 and the top confinement layer 402 will (in conjunction with STI regions—see below) help prevent diffusion of the well dopants which will be implanted into the SiGe layer 302. Namely, as provided above, of particular concern are n-well dopants such as arsenic (As) which experience an increased rate of diffusion in SiGe as compared to Si. Thus, Si is well suited as a confinement layer material.

As such, according to an exemplary embodiment, confinement layer 402 is formed from Si epitaxially grown on the SiGe layer 302. As provided above, the confinement layer 402 is preferably thin to avoid lattice mismatch concerns. Namely, according to an exemplary embodiment, the confinement layer 202 is formed to a thickness of from about 2 nm to about 10 nm, and ranges therebetween, e.g., about 5 nm.

Figure 5:
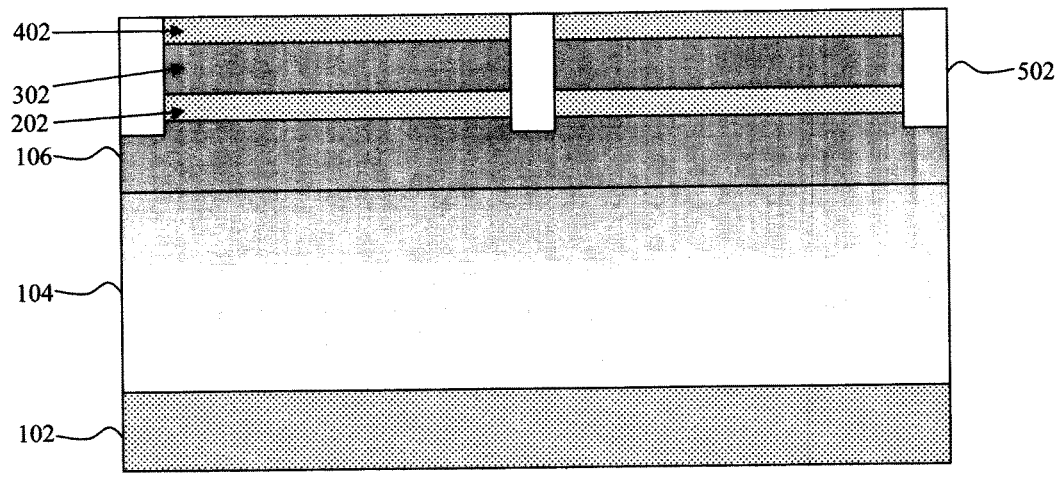
FIG. 5 is a cross-sectional diagram illustrating shallow trench isolation (STI) having been used to define at least one (nFET) active area and at least one (pFET) active area in the relaxed SiGe layer according to an embodiment of the present invention.

Lateral confinement of the well dopants is achieved via STI. Namely, as shown in FIG. 5, STI is used to define multiple active areas in the SiGe layer 302. In the present (non-limiting) example, one active area corresponds to an n-channel field effect transistor (labeled "nFET") and another active area corresponds to a p-channel field effect transistor (labeled "pFET"). See FIG. 5. STI generally involves using standard lithography and etching techniques to pattern one or more trenches in the active layer, and then filling the trenches with an insulator (such as an oxide that is generically referred to herein as an STI oxide) forming STI regions, e.g., STI regions 502.

In this particular implementation, in order to provide confinement, it is preferable that the STI regions 502 extend through the confinement layer 402, through the SiGe layer 302, and at least down to the confinement layer 202. As shown in FIG. 5, the STI regions 502 can optionally extend through the confinement layer 202 and into the top portion 106 of the SRB layer 104. Patterning for the STI regions can involve multiple etching steps to pattern the various Si (confinement) and SiGe (active) layers. By way of example only, an anisotropic etching process such as reactive ion etching (or RIE) can be employed involving multiple RIE steps with Si-selective and SiGe-selective etch chemistries.

Figure 6:
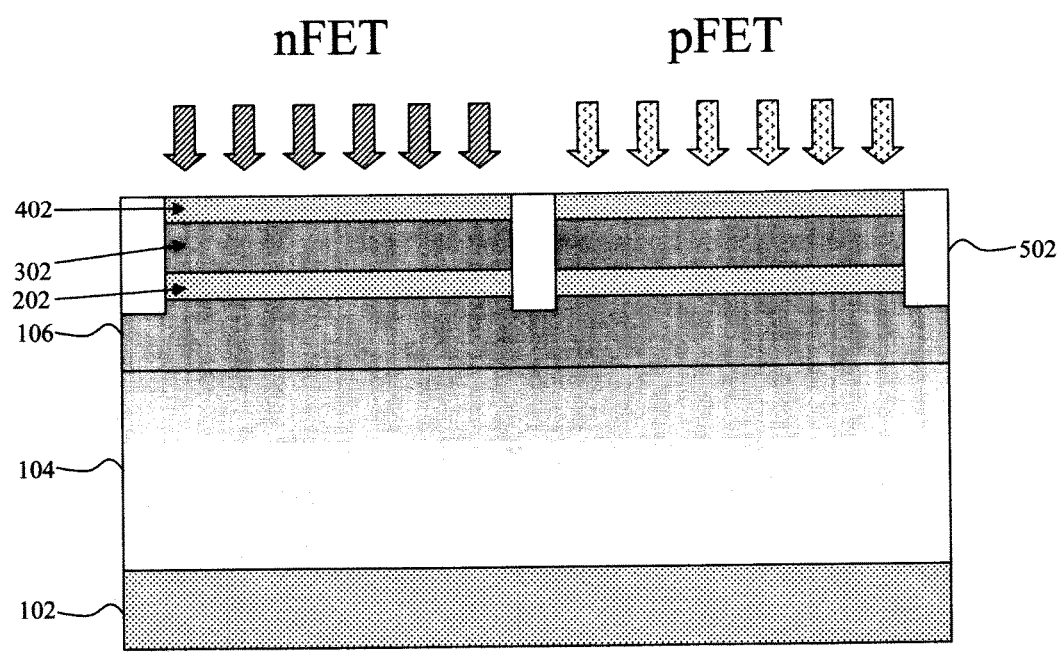
FIG. 6 is a cross-sectional diagram illustrating well implants having been performed into the nFET and pFET active areas of the SiGe layer according to an embodiment of the present invention.

Well implants are next performed into the nFET and pFET active areas of the SiGe layer 302. See FIG. 6. According to an exemplary embodiment, the well implant into the nFET active area is boron (B) forming a p-well and the well implant into the pFET active area is arsenic (As) forming an n-well.

The process for performing the well implants is known in the art. For instance, a multi-masking procedure can be employed, wherein each of the active areas is selectively masked while dopants are implanted in the other.

Figure 7:
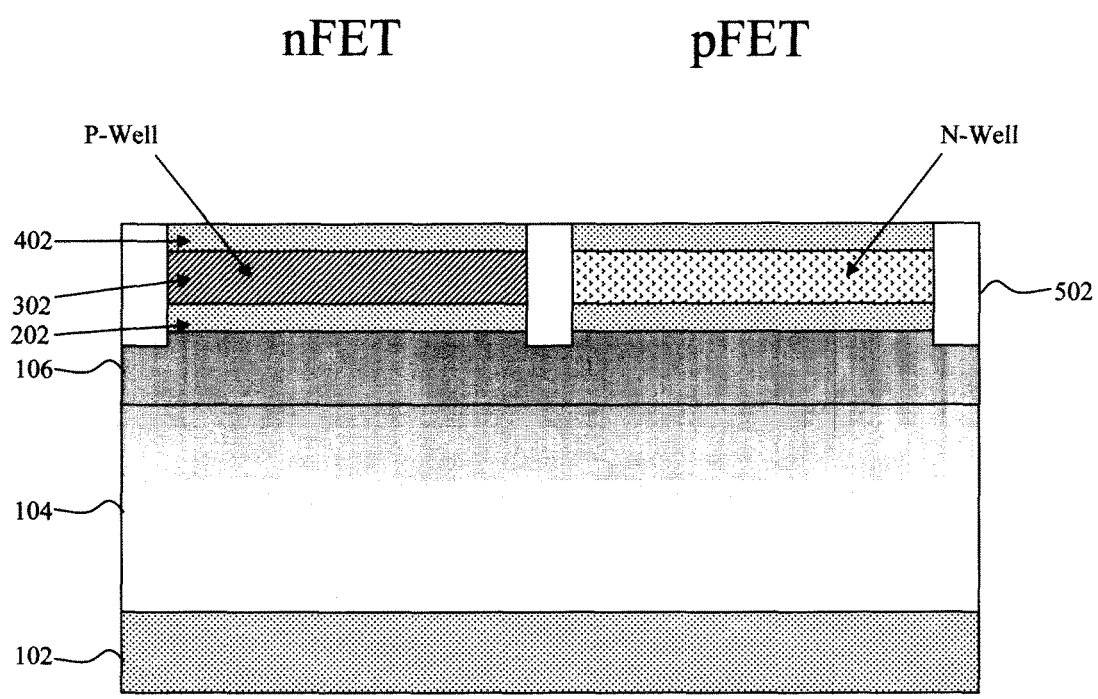
FIG. 7 is a cross-sectional diagram illustrating, as a result of the well implants, a p-well having been formed in the nFET active area and an n-well having been formed in the pFET active area according to an embodiment of the present invention.

As shown in FIG. 7, the result is the formation of a p-well in the nFET active area and an n-well in the pFET active area. Advantageously, the confinement layers 202 and 402 and the STI regions 502 serve to effectively suppress diffusion of the dopants from the respective active areas of the SiGe layer 302. During this process, some of the n-well dopant (e.g., As) might diffuse into and slightly n-doping the confinement layers in the pFET active area. However, as described below, the top confinement layer 402 will become part of the pFET device and thus this slight doping of the confinement layer in the pFET active area will not negatively affect the pFET device.

Figure 8:
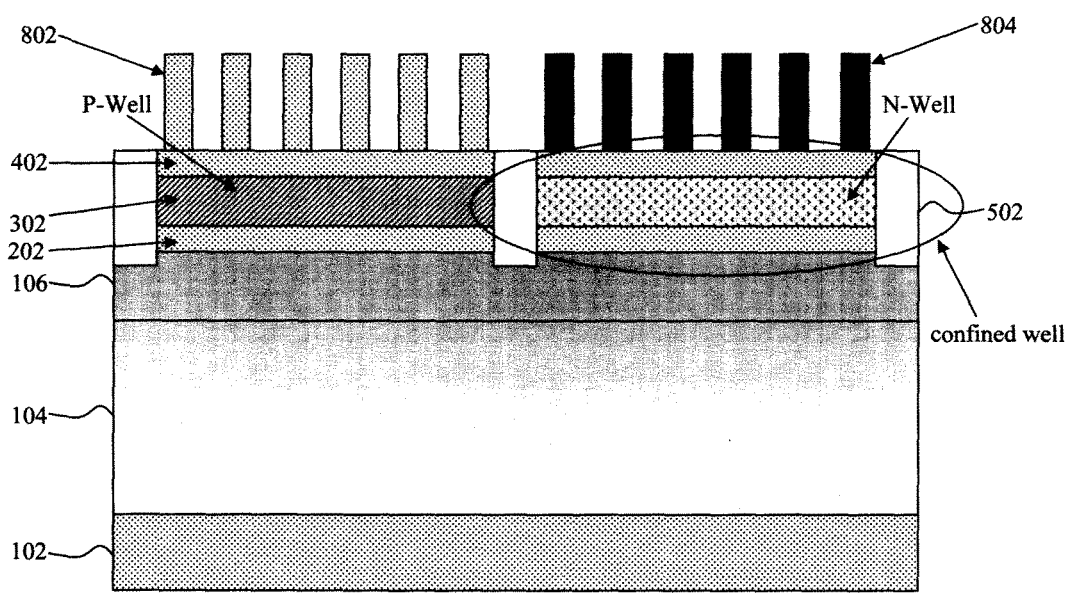
FIG. 8 is a cross-sectional diagram illustrating, a plurality of tensile strain Si fins having been formed in the n-FET active area, and a plurality of compressive strain SiGe fins having been formed in the p-FET active area according to an embodiment of the present invention.

The resulting structure can then be used as the platform for a variety of different device configurations. For instance, FIG. 8 illustrates an exemplary n-FET and p-FET FinFET design. In the example shown in FIG. 8, a plurality of strained (e.g., tensile strained) Si FinFETs are formed on the top confinement layer 402 in the nFET active area, and a plurality of strained (compressive strained) SiGe FinFETs are formed on the top confinement layer 402 in the pFET active area. To form the Si FinFETs in the nFET active area, a layer of strained Si can be epitaxially grown on the top confinement layer 402 in the nFET active area. Selective masking of the top confinement layer 402 in the pFET active area can be performed. Standard lithography and etching techniques, such as sidewall image transfer or SIT, can be used to pattern the strained Si into a plurality of fins 802. Similarly, to form the SiGe FinFETs in the pFET active area, a layer of strained SiGe can be epitaxially grown on the top confinement layer 402 in the pFET active area. To form compressively strained SiGe, this epitaxial SiGe grown in the pFET active area preferably has a higher percentage of Ge. For example, according to an exemplary embodiment, the strained SiGe can have a Ge concentration of from about 40 at. % to about 60 at. %, and ranges therebetween. Selective masking of the top confinement layer 402 in the nFET active area can be performed. Standard lithography and etching techniques can be used to pattern the strained SiGe into a plurality of fins 804.

The process for forming tensile strained Si and compressive strained SiGe in the nFET and pFET active areas of the present device structure is accomplished as follows: the relaxed SiGe from the graded buffer layer, or strain relief buffer has, has a certain lattice constant. Epitaxial Si grown on the relaxed SiGe will be tensile strained since the lattice constant of Si is smaller than that of SiGe, but the epitaxial Si aligns to the underlying lattice of the SiGe. By way of example only, say for instance that the top portion 106 of the SRB layer 104 has a Ge concentration of 20 at. % and a lattice constant of 5.472 angstroms (Å). If Si is epitaxially grown on the SRB it will be tensile strained since the lattice constant of Si is smaller than that of the SiGe, however the epitaxial Si will align to the underlying lattice of the (e.g., 20 at. % Ge) SiGe. On the other hand, with a higher Ge percentage SiGe it is exactly the opposite. Namely, epitaxial SiGe with a higher percentage of Ge, e.g., 50 at. % Ge, has a larger lattice constant than epitaxial SiGe with a lower Ge concentration (e.g., SiGe with 20 at. % Ge). So when grown on the smaller lattice constant template, the SiGe with 50 at. % Ge will be compressively strained.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a semiconductor device, the method comprising the steps of:
    forming a silicon germanium (SiGe) stress relief buffer layer on a substrate;
    growing a bottom confinement layer on the stress relief buffer layer;
    growing a SiGe layer on the bottom confinement layer;
    growing a top confinement layer on the SiGe layer;
    forming shallow trench isolation (STI) regions extending through the top confinement layer, through the SiGe layer, and at least down to the bottom confinement layer, wherein the STI regions define at least one first active area and at least one second active area in the SiGe layer; and
    implanting a p-well dopant into a region of the SiGe layer in the at least one first active area; and
    implanting an n-well dopant into another region of the SiGe layer in the at least one second active area, wherein the p-well dopant is confined to the at least one first active area and the n-well dopant is confined to the at least one second active area by the top confinement layer, the bottom confinement layer, and the STI regions.

2. The method of claim 1, wherein the substrate comprises a silicon (Si) substrate.

3. The method of claim 1, wherein the bottom confinement layer and the top confinement layer each have a thickness of from about 2 nanometers to about 5 nanometers.

4. The method of claim 1, wherein the bottom confinement layer and the top confinement layer each comprises epitaxial Si.

5. The method of claim 1, wherein the SiGe layer has a thickness of from about 100 nanometers to about 500 nanometers.

6. The method of claim 1, wherein the SiGe layer has a Ge concentration of from about 15 atomic percent to about 30 atomic percent.

7. The method of claim 1, wherein the STI regions extend through the bottom confinement layer and into the stress relief buffer layer.

8. The method of claim 1, wherein the p-well dopant comprises boron and the n-well dopant comprises arsenic.

9. A semiconductor device, comprising:
    a SiGe stress relief buffer layer on a substrate;
    a bottom confinement layer on the stress relief buffer layer;
    a SiGe layer on the bottom confinement layer;
    a top confinement layer on the SiGe layer;
    STI regions extending through the top confinement layer, through the SiGe layer, and at least down to the bottom confinement layer, wherein the STI regions define at least one first active area and at least one second active area in the SiGe layer;
    a p-well dopant implanted into a region of the SiGe layer in the at least one first active area; and
    an n-well dopant implanted into another region of the SiGe layer in the at least one second active area, wherein the top confinement layer, the bottom confinement layer, and the STI regions confine the p-well dopant to the at least one first active area and the n-well dopant to the at least one second active area.

10. The semiconductor device of claim 9, wherein the substrate comprises a Si substrate.

11. The semiconductor device of claim 9, wherein the bottom confinement layer and the top confinement layer each have a thickness of from about 2 nanometers to about 10 nanometers.

12. The semiconductor device of claim 9, wherein the bottom confinement layer and the top confinement layer each comprises epitaxial Si.

13. The semiconductor device of claim 9, wherein the SiGe layer has a thickness of from about 100 nanometers to about 500 nanometers.

14. The semiconductor device of claim 9, wherein the SiGe layer has a Ge concentration of from about 15 atomic percent to about 30 atomic percent.

15. The semiconductor device of claim 9, wherein the STI regions extend through the bottom confinement layer and into the stress relief buffer layer.

16. The semiconductor device of claim 9, wherein the p-well dopant comprises boron and the n-well dopant comprises arsenic.

17. The method of claim 1, further comprising the step of:
    forming strained fins on the top confinement layer in the at least one first active area and in the at least on second active area.

18. The semiconductor device of claim 9, further comprising:
    strained fins on the top confinement layer in the at least one first active area and in the at least on second active area.

19. The semiconductor device of claim 18, wherein the strained fins on the top confinement layer in the at least one first active area are tensile strained, and wherein the strained fins on the top confinement layer in the at least one second active area are compressive strained.

* * * * *